United States Patent [19]

Patterson et al.

[11] Patent Number: 5,071,677
[45] Date of Patent: Dec. 10, 1991

[54] HALOGEN-ASSISTED CHEMICAL VAPOR DEPOSITION OF DIAMOND

[75] Inventors: Donald E. Patterson; Robert H. Hauge; C. Judith Chu; John L. Margrave, all of Houston, Tex.

[73] Assignee: Houston Advanced Research Center, The Woodlands, Tex.

[21] Appl. No.: 528,804

[22] Filed: May 24, 1990

[51] Int. Cl.⁵ ................... C23C 16/26; C23C 16/46
[52] U.S. Cl. .................... 427/249; 423/446
[58] Field of Search .......... 427/249, 38, 39, 45.1; 423/446; 156/613, 614

[56] References Cited

U.S. PATENT DOCUMENTS

| | | |
|---|---|---|
| 2,610,129 | 9/1952 | Eversole . |
| 2,693,421 | 11/1954 | Eversole . |
| 2,819,887 | 2/1954 | Eversole . |
| 3,030,187 | 4/1962 | Eversole . |
| 3,030,188 | 4/1962 | Eversole . |
| 3,093,507 | 6/1963 | Lander . |
| 3,212,934 | 10/1965 | Lander . |
| 3,370,983 | 2/1968 | Lander . |
| 3,371,996 | 3/1968 | Hibshman . |
| 3,511,715 | 5/1970 | Angus . |
| 3,527,622 | 9/1970 | Angus et al. . |
| 3,630,677 | 12/1971 | Angus . |
| 3,630,679 | 12/1971 | Angus . |
| 3,661,526 | 5/1972 | Angus et al. . |

(List continued on next page.)

FOREIGN PATENT DOCUMENTS

| | | |
|---|---|---|
| 62-278193 | 12/1987 | Japan . |
| 63-297299 | 12/1988 | Japan . |
| 1-201479 | 8/1989 | Japan . |
| 1-313393 | 12/1989 | Japan . |
| 339134 | 5/1980 | U.S.S.R. . |

OTHER PUBLICATIONS

Peter K. Bachmann, Russell Meysier—"Emerging Technology of Diamond Thin Films"; 5/15/89; C&EN, pp. 24–38.

J. C. Angus, et al.—"Diamond Growth at Low Pressures"; Oct. 1989; MRS Bulletin; pp. 38–47.

Karl E. Spear—"Diamond—Ceramic Coating of the Future"; 1989; J. Am. Ceram. Soc.; pp. 171–191.

R. A. Rudder et al.—paper on "Investigation of $CH_4/CF_4$ Gas-Substrate Interactions"; Jul. 1989.

W. A. Yarbrough, et al.—"Current Issues and Problems in the Chemical Vapor Deposition of Diamond"; Feb. 1990; Science, vol. 247; pp. 688–696.

Primary Examiner—Shrive Beck
Assistant Examiner—Margaret Burke
Attorney, Agent, or Firm—Vinson & Elkins

[57] ABSTRACT

The present invention is directed to a method for depositing diamond films and particles on a variety of substrates by flowing a gas or gas mixture capable of supplying (1) carbon, (2) hydrogen and (3) a halogen through a reactor over the substrate material. The reactant gases may be pre-mixed with an inert gas in order to keep the overall gas mixture composition low in volume percent of carbon and rich in hydrogen. Pretreatment of the reactant gases to a high energy state is not required as it is in most prior art processes for chemical vapor deposition of diamond. Since pre-treatment is not required, the process may be applied to substrates of virtually any desired size, shape or configuration.

The reactant gas mixture preferably is passed through a reactor, a first portion of which is heated to a temperature of from about 400° C. to about 920° C. and more preferably from about 800° C. to about 920° C. The substrate on which the diamond is to be grown is placed in the reactor in a zone that is maintained at a lower temperature of from about 250° C. to about 750° C., which is the preferred diamond growth temperature range. The process preferably is practiced at ambient pressures, although lower or higher pressures may be used. Significant amounts of pure diamond films and particles have been obtained in as little as eight hours. The purity of the diamond films and particles has been verified by Raman spectroscopy and powder x-ray diffraction techniques.

75 Claims, 2 Drawing Sheets

U.S. PATENT DOCUMENTS

| | | |
|---|---|---|
| 3,711,595 | 1/1973 | Maragave et al. |
| 3,961,103 | 6/1976 | Aisenberg |
| 3,998,661 | 12/1976 | Chang et al. |
| 4,006,040 | 2/1977 | Cline et al. |
| 4,012,236 | 3/1977 | Anthony et al. |
| 4,040,868 | 8/1973 | Chang et al. |
| 4,081,293 | 3/1978 | Cline et al. |
| 4,108,685 | 8/1978 | Chang et al. |
| 4,112,328 | 9/1978 | Wolfe et al. |
| 4,141,757 | 2/1979 | Cline et al. |
| 4,361,641 | 11/1982 | Angus et al. |
| 4,377,565 | 3/1983 | Setaka |
| 4,434,188 | 2/1984 | Kamo et al. |
| 4,443,420 | 4/1984 | Sato et al. |
| 4,504,519 | 3/1985 | Zelez |
| 4,587,172 | 5/1986 | Roy et al. |
| 4,650,742 | 3/1987 | Goto et al. |
| 4,675,302 | 6/1987 | Roy et al. |
| 4,767,608 | 8/1988 | Matsumoto et al. |
| 4,784,466 | 11/1988 | Khoe et al. |
| 4,801,566 | 1/1989 | Limaye et al. |
| 4,802,733 | 2/1989 | Bachmann et al. |
| 4,808,318 | 2/1989 | Komarneni et al. |
| 4,813,048 | 3/1989 | Yamane et al. |
| 4,816,286 | 3/1989 | Hirose |
| 4,829,031 | 5/1989 | Roy et al. |
| 4,869,924 | 9/1989 | Ito |
| 4,871,383 | 10/1989 | Bachmann et al. |
| 4,873,115 | 10/1989 | Matsumura et al. |

HALOGEN-ASSISTED CHEMICAL VAPOR DEPOSITION OF DIAMOND

BACKGROUND OF THE INVENTION

1. Field of the Invention

This invention relates generally to a method for producing diamond by chemical vapor deposition.

2. Description of the Prior Art

Diamond has long been sought after not only for its intrinsic beauty and value as a gemstone but for its many unique and valuable mechanical, electrical, optical, and thermal properties. Diamond is the hardest material occurring in nature, has a low coefficient of friction, and is extremely resistant to chemical attack. It also is classified as a high bandgap semiconductor, is optically transparent to much of the electromagnetic spectrum, and has the highest heat conductivity of any material at room temperature. While, in fact, naturally occurring diamonds are far from scarce, humankind has long sought to produce these crystals synthetically.

The first such syntheses involved the application of high pressures and temperatures to bring about the allotropic transformation of graphite to diamond (for example, see U.S. Pat. No. 2,947,608). More recently, numerous studies have shown that diamond can be produced synthetically at low pressures using various forms of chemical vapor deposition (CVD) processes employing a gaseous carbon compound (for example, see U.S. Pat. Nos. 3,030,187, 4,767,608, and 4,873,115).

In all of the CVD processes to date, with the exception of CVD growth on diamond single crystals where the growth is epitaxial for thin layers, the diamond produced takes the form of a thin polycrystalline film of extremely small diamond particles (typically less than 100 μm in diameter). In many of the processes, diamond is not formed by itself but rather in combination with graphite and diamond-like carbon (the latter species being a carbon allotrope with properties between those of graphite and diamond). The processes all employ some high energy method of pretreating or activating one or more of the reactant species such as microwave or rf-generated plasmas (plasmas being the mixture of electrous and gaseous ions formed when the gases are heated to the range of 5,000° C. to 30,000° C.), or hot filaments, high temperature flames, arc discharges, electron beams, lasers, etc. (which heat the gases to a temperature of 2,000° C. 3,000° C. or higher). All such high-temperature, high-energy steps comprise methods of pre-treatment of said gases to activate them to a high energy level. The activated gases then are impinged upon a substrate, with diamond growth occurring principally on the substrate surfaces directly in the path of the activated gases or plasma. Such processes are expensive because of the energy costs of activating the reactant gases and are relatively low-volume because of the difficulties of activating large volumes of gases. Also, they make it difficult to coat three dimensional or irregular objects with diamond film, because the objects must be turned to expose successive sides or areas to the flow from the activated gases.

Most existing CVD processes also occur at pressures less than 100 Torr; those which do not, typically produce very impure diamond/graphite mixtures.

Many potential markets exist for diamond films and may involve the use of diamond coatings for extreme hardness, inertness to chemical attack, heat conductance, and other desirable properties. Some applications may further use doped diamond for its unique electrical properties. A major drawback to presently existing CVD diamond coating technologies is the difficulty of placing a diamond film uniformly on objects with complex shapes. Another major problem exists with the high temperatures (typically >700° C.) usually required for diamond formation in existing CVD processes. Our invention eliminates many of these problems.

SUMMARY OF THE INVENTION

The object of the present invention is to provide a CVD process for producing pure diamond which can be performed in a simple heated flow tube reactor which operates over a range of pressure up to and above one atmosphere. The method and apparatus do not require the use of high energy activation methods which are required in previous methods. Thus, the apparatus and process are simpler and generally more cost effective than previous methods.

A further object of this invention is to provide diamond coatings on a variety of substrate surface shapes.

An additional object of this invention is to provide a method of depositing diamond at temperatures much less than 700° C.

In accordance with the present invention, diamond films and particles can be produced on a variety of substrates (both in terms of material composition and shape) by flowing a gas or gas mixture capable of supplying (1) carbon, (2) hydrogen, and (3) any of the halogen atoms through a reactor over a heated substrate material. The reactant gases may be premixed with an inert gas in order to keep the overall gas mixture composition low in volume percent of carbon and rich in hydrogen. The gas mixture preferably is passed through a tube reactor, a portion of which has been heated to a first temperature of from about 400° C. to about 920° C., and more preferably from about 800° C. to about 920° C. The substrate on which diamond is to be grown preferably is placed in the reactor in a position that is maintained at a second temperature of from about 250° C. to about 750° C., which is the preferred diamond growth temperature range. The process preferably occurs at ambient pressures (although lower or higher pressures can be used). Significant amounts of pure diamond films and diamond particles have been obtained in as little as 8 hours. The purity of the diamond films and particles has been verified by Raman spectroscopy and powder X-ray diffraction techniques.

BRIEF DESCRIPTION OF THE DRAWINGS

The foregoing and other objects and advantages of the invention will be apparent from the following specification and from the accompanying drawings in which like numerals indicate like parts and in which.

DESCRIPTION OF THE PREFERRED EMBODIMENTS

Figure 1:
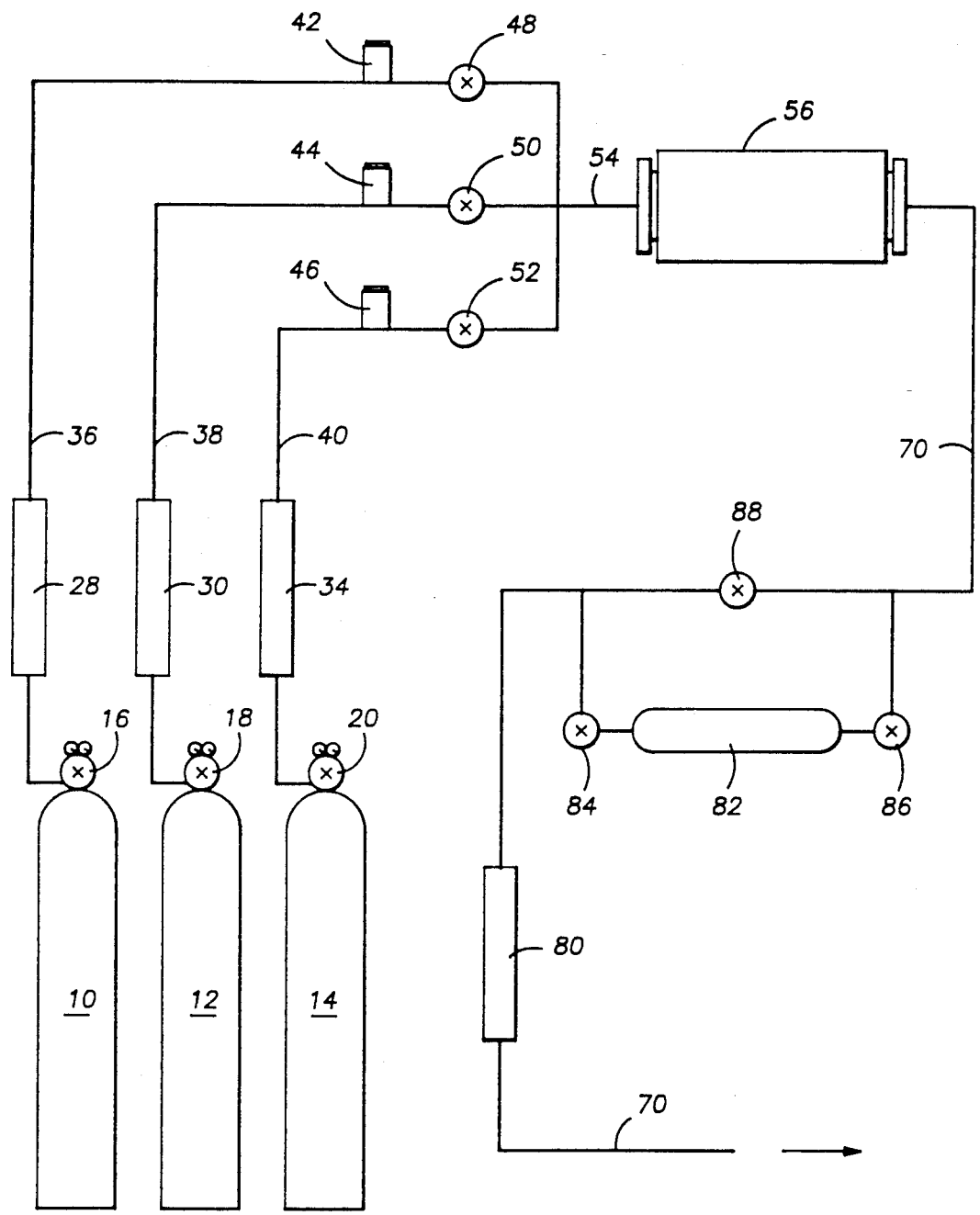
FIG. 1 is a schematic illustration of the dynamic flow apparatus for the halogen-assisted preparation of diamond films and particles in accordance with the present invention.

The present invention is the first known method for producing substantially pure diamond films and particles from a mixture of gases which are capable of supplying carbon, hydrogen, and any halogen to the reactant system, without requiring pre-treatment to activate the gases and while maintaining a system pressure of approximately one atmosphere. Previous CVD diamond growing systems have employed some form of pretreatment means for activating the gas to a high energy level prior to the actual diamond growth on a heated substrate, and all prior art methods require substrate temperatures in excess of about 700° C. All successful prior art CVD methods also have operated at substantial vacuums. Those prior art methods working at greater than a few tens of Torr of pressure generally have produced impure diamond films and particles. Our invention, however, when operated at ambient pressure, can produce pure diamond films and particles.

In the present invention, the gas species capable of supplying the halogen atom may be elemental fluorine, chlorine, bromine, iodine or any interhalogen compound such as $ClF_3$, $BrF_3$, etc. It may also be any halogenated organic compound with sufficient vapor pressure. The halogen atom also may be supplied by an inorganic gas such as $XeF_2$, $OF_2$, $NF_3$, etc., which is capable of supplying a halogen atom to the reaction mixture. Additionally, compounds such as $PF_5$, $BF_3$, etc., may be used to supply both the halogen atom and a dopant atom for desired electrical properties.

It is felt that the driving force for the reaction is the production of thermodynamically stable HX molecules where X is a halogen atom. In the present invention, the halogen containing molecules which are preferred for the growth of diamond films and particles include fluorine, $C_1$ to $C_3$ fluorohydrocarbons such as methyl fluoride, difluoromethane, trifluoromethane, tetrafluoromethane, and 1,1-difluoroethylene, and $C_1$, and $C_2$ chlorofluorocarbons such as dichlorodifluoromethane and trichlorofluoroethylene. Species such as (but not limited to) carbon tetrachloride, tribromomethane, and methyl iodide also have been used successfully in this invention to produce diamond films and particles.

The gas species capable of supplying hydrogen atoms to the process is typically hydrogen but can be any hydrogen containing gaseous compound. Some suitable compounds include the simple alkanes such as methane and ethane and unsaturated hydrocarbons such as ethylene and acetylene.

The gas capable of supplying carbon atoms to the process of the present invention include the lower molecular weight hydrocarbons and halogenated hydrocarbons.

In accordance with the present invention, the reactant gases are premixed and may be diluted with an inert gas such as helium, neon, or argon to yield a carbon species concentration lower than approximately 10 volume percent of the total mixture. If the carbon concentration exceeds approximately 10 volume percent, a non-diamond carbonaceous film may be deposited on the growth substrate. It also is preferred to run the reaction rich in the hydrogen-containing species. The best growths of diamond have been found to occur if the gas mixture contains more hydrogen atoms than carbon atoms and, most preferably, at least four times or more as many hydrogen atoms as carbon atoms.

Halogen atoms may be present in the gas mixture in numbers greater or less than the number of carbon atoms, but preferably always less than the number of hydrogen atoms. Mixtures of hydrogen, carbon and halogen containing species may be used with or without inert gas dilution, but preferably should meet the desired concentration ranges.

In our experimental apparatus described below, flow rates of the carbon containing species preferably range from about 0.1 standard cubic centimeter per minute (sccm) to several standard liters per minute (slm). Hydrogen normally is supplied from about 10 cubic centimeters per minute to several tens of liters per minute. Halogen-containing species flow rates preferably range from about 0.1 (sccm) to about several liters per minute.

The inert gas flow can be omitted entirely or can be run up to several liters per minute, in order to meet the overall gas concentration targets.

Diamond films and particles are produced in the present invention by introducing the reactant gases as a mixture in a dynamic flow condition into a reaction chamber and flowing the gases over a heated growth substrate. The growth substrate may be any material which is capable of withstanding temperatures in the 250° C. to 750° C. range which facilitate growth. It is possible to deposit diamond films on substrate materials that can only withstand temperatures as high as approximately 250°–400° C. It has been found that maximum diamond growth rates are achieved by rubbing the substrate surface with very fine diamond polishing grit (grit size less than 1 $\mu$m) and removal of any remaining grit prior to insertion of the substrate into the reactor. Diamond can, however, be grown on an untreated substrate over a longer period of time.

The substrate on which diamond is to be grown may be heated directly (as by electrical resistance or microwaves) to reach the diamond growth temperature zone of 250° to 750° C., with the diamond formation gas mixture flowing at ambient temperatures over the heated substrate. Alternatively, the substrate may be heated to the desired temperature range by heating the reactant gases and flowing the hot gases over the substrate.

It has been further discovered in accordance with the present invention that the maximum rates of diamond film growth on the substrate are achieved if the reactant gases are heated to a first temperature of from about 400° C. to about 920° C. and, more preferably, from about 800° C. to about 920° C., and then cooled to a second, lower, temperature in the range of from about 250° C. to about 750° C. as they flow over the diamond growth substrate. In our experimental apparatus described below for performing the process of the present invention, the creation of two temperature zones was accomplished by heating the central portion of the outside of the accomplished by heating the central portion of the outside of the cylindrical reactor body with electrical resistance coils and simultaneously cooling the ends of the cylindrical body with circulated water. This produced a temperature gradient in which the reactor was coolest at each end (where water circulation was cooling the reactor body) and hottest in its central zone (where the electrical resistance heating was most effective). It was discovered that some diamond deposition occurred in the upstream end of the reactor where the temperature zone was in the range of 250° to 750° C., but that the greatest rates of diamond deposition occurred in the downstream portion of the reactor where the substrate was in the temperature range of 250° to 750° C., but where the reactant gases first had flowed through the hotter central portion of the reactor and been heated to a temperature of about 400° to 900° C. or, most preferably, about 800° C. to 920° C. Of course, many alternative means of producing the two temperature zones in the reactor are possible.

Since the rate of diamond formation was greatest on that portion of the substrate located downstream from the high temperature zone of the reactor and in a temperature zone of about 250° to 750° C., it should be possible to design a reactor to accommodate almost any size or length of substrate in which the substrate is heated to the diamond formation temperature range of 250° to 750° C. or maintained entirely within a zone in the reactor where the reactant gases are heated to such temperature range.

Substrate material which is outside of the diamond growth temperature range may have no deposited material, or may have non-diamond carbon or various other materials deposited on it.

The reaction is allowed to proceed until the desired amount of diamond has been deposited on the substrate. Growth periods of 4 hours to several weeks are typical.

Figure 3:
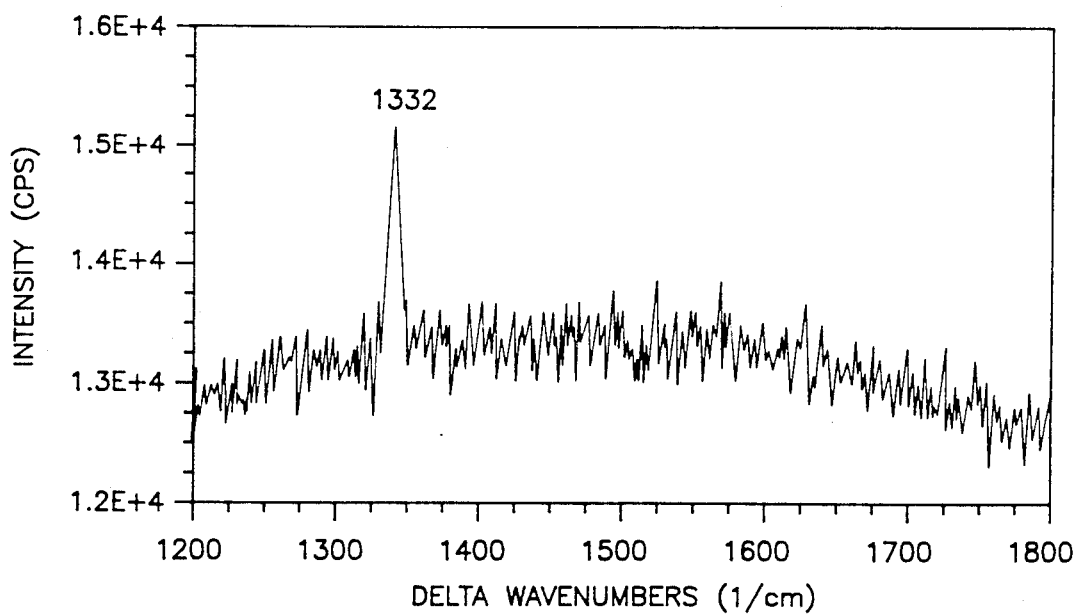
FIG. 3 is a graph illustrating a Raman spectrum analysis of diamond films prepared in accordance with the present invention.

The diamond films and particles prepared in accordance with the present invention have been analyzed by the use of Raman spectroscopy and powder X-ray diffraction techniques. Raman spectroscopy is particularly useful in both identifying the presence of diamond and determining its purity in relation to other carbonaceous materials. Diamond gives a sharp, narrow first-order Raman line at 1332 cm$^{-1}$. Graphite (which is approximately a fifty-times better Raman scatterer than is diamond) gives intense, broad Raman peaks at approximately 1360 and 1580 cm$^{-1}$. X-ray diffraction patterns for diamond and graphite can be quite similar and should be used in conjunction with Raman spectroscopy for verifying the presence of diamond. FIG. 3 illustrates a Raman spectrum of a diamond film prepared in accordance with the present invention showing the appearance of the diamond peak at 1332 cm$^{-1}$ with no indication of bands due to graphite being present.

Figure 2:
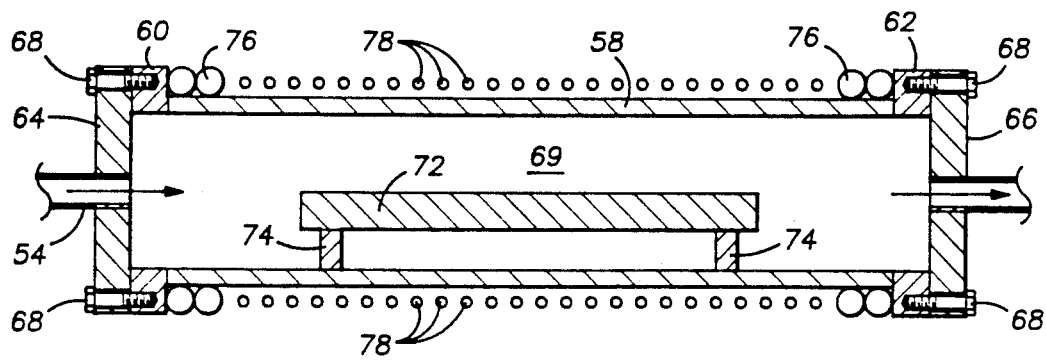
FIG. 2 is an enlarged illustration in vertical section of the reactor of FIG. 1.

The CVD diamond formation process in accordance with the present invention may be carried out in a wide range of apparatus. FIGS. 1 and 2 are simplified illustrations of one such apparatus similar to that used in laboratory experiments discussed below in connection with the invention.

FIG. 1 is a schematic illustration of a dynamic flow apparatus for the halogen assisted preparation of diamond film and particles in accordance with the present invention. The apparatus includes means for supplying three gaseous components to the process: (1) a halogen-containing species such as fluorine, chlorine or any halogen-containing hydrocarbon, (2) a hydrogen and carbon-containing species such as methane or another simple hydrocarbon or hydrogen, and (3) helium or another inert gas. In the apparatus as illustrated in FIG. 1, these means for supplying gas comprise regulated commercial gas cylinders 10, 12 and 14 containing the respective three component gases. The gases from cylinders 10, 12, and 14 exit through pressure regulators 16, 18, and 20 via tubing lines 22, 24, 26 (preferably of copper or polytetrafluoroethylene tubing) to gas cleaning systems illustrated schematically at 28, 30 and 34. In the gas cleaning systems, the component gases are cleaned of any undesirable components by passing them through appropriate cleaning agents. For example, HF found in commercial fluorine is removed by passing it through NaF, and water in other gases is removed by passing the gases through $CaSO_4$. From the gas cleaning systems, the component gases proceed through tubing 36, 38 and 40 to flow meters 42, 44, 46. These flow meters may be any of various commercially available flow meters for accurately measuring flow of the three component gases. The gas then passes through needle valves 48, 50, 52 which accurately regulate the flow of each of the three individual gas streams. From the needle valves, the three gas streams are combined and flow as a gas mixture through a single tubing 54 into the reactor 56.

The reactor 56 (illustrated in greater detail in FIG. 2) comprises an elongated cylindrical body 58 formed of a material which can withstand the temperatures and reactants used in the diamond growth process. If the process employs elemental fluorine, then the reactor body should be constructed of nickel or a nickel based alloy such as Monel or Inconel in order to survive the effects of fluorine at elevated temperatures. When not using elemental fluorine, it would be possible to use any number of metals for the reactor body material as well as various ceramic and glassy materials. Preferably, the body 58 is formed of a metal, ceramic or glass tube. The body 58 has flanges 60, 62 formed at its upstream and downstream ends. Flange plates 64, 66 fasten to the flanges by fasteners 68 complete the reactor body.

The inside diameter of the cylindrical reactor body 58 and the flange plates 64, 66 define a reaction chamber 69. The chamber 69 may be of any size that can be efficiently heated and will allow for the temperature gradients for diamond growth. In our preferred design, we use metal, ceramic or glass tubes varying from 12 inches to 4 feet in length and from 1 to 3 inches in inside diameter.

The gas mixture flows into and out of the reactor 56 by means of inlet tubing 54 and outlet tubing 70 passing through openings in the reactor end plates 64, 66.

The substrate 72 upon which the diamond films are grown is supported within the reaction chamber by any desired means, such as brackets 74 which permit the reactant gases to flow evenly around all sides of the substrate. One of the end plates 64 or 66 is removed in order to place the substrate in, and remove the substrate from, the reactor.

When the reactor body 58 is made from a high heat conductive material, such as metal, means preferably are provided for cooling the reactor flanges 60, 62 and end plates 64, 66 in order to facilitate removal of the end plates when it is desired to place a substrate in or remove a substrate from the reactor. In the preferred embodiment, such cooling means comprise coils of copper tubing 76 through which chilled water is circulated. Where the reactor body is made of less heat conductive material, such as ceramic or glass, cooling means may not be required.

Means also are provided for heating the reactor in order to heat the gas mixture and substrate in the reaction chamber to the desired temperatures. In the apparatus as shown in FIG. 1, such means comprise electrical resistance coils 78 disposed about the outer circumference of the reactor body 58 and through which electrical current is flowed in controlled amounts in order to generate the desired heat. Alternatively, the reaction chamber may be heated by conduction heating, and/or by induction heating. Fastest diamond growth has been obtained when the high temperature region of the chamber is heated to between 800° C. and 920° C. Heat preferably is supplied to the reaction chamber in such a manner that a temperature gradient is established within the chamber that allows for the gas mixture to be heated in a first zone to a high temperature in the range of about 400° C. to 920° C. and then to cool gradually as it flows downstream in the reactor to a second zone which is approximately 250° C. to 700° C. in temperature. It is in this temperature range where the growth of diamond films and particles preferably occurs.

In the experimental apparatus illustrated, the provision of first and second temperature zones is accomplished through the use of the electrical resistance heating coil 78 disposed about the outer circumference of the reactor and the water-filled cooling coils 76 disposed about the upstream and downstream ends. Heat from the heating coils is transmitted through the body of the reactor to the reaction chamber 69 where it heats gases flowing through the reaction chamber. However, the cooling effect produced by the water-filled coil 76 at the upstream and downstream ends of the reactor reduces the temperature of the reactor body near its upstream and downstream ends. The result is that the gases in the reactor reach their highest temperature near the longitudinal center of the reactor and are coolest at the upstream and downstream ends of the reactor, with a gradual temperature gradient extending between those zones.

As illustrated, the substrate 72 may extend through any desired length of the reactor chamber. Where the substrate is of sufficient length to extend from the upstream, cooler, zone of the reactor, through the central higher temperature zone and into the downstream, cooler, zone, it has been observed that substantially no diamond deposition occurs on the portions of the substrate near the central portion of the reactor where the temperature of the substrate and flowing gases exceeds approximately 750° C. Diamond deposition is observed on both the upstream and downstream portions of the substrate where the temperature of the substrate, and of the flowing gases, is in the range of approximately 250° to approximately 750° C.; however, the rate of diamond deposition is substantially greater at the downstream end, thus indicating that the rate of diamond deposition is enhanced by the reactant gases first having been heated to a temperature above that of the diamond formation temperature range and subsequently cooled to a temperature within the diamond formation range.

The reactant gases exit from the downstream end of the reactor through tubing 70 and through a charcoal trap 80 which converts elemental fluorine in the gases into CF$_4$ which is harmless to the environment. From the charcoal trap 80, the reactant gases are vented to the atmosphere.

Means also are provided, preferably upstream from the charcoal trap 72, for sampling reactant gases. In the preferred embodiment, these comprise a gas sampling trap 82, which is connected between valves 84, 86, with an additional valve 88 being provided in tubing line 70. Valve 88 normally is opened and valves 84, 86 are closed. When it is desired to collect a gas sample, valve 88 is closed and valves 84, 86 are opened so that the gas in tubing 70 will flow through the sampling trap 82. Valves 84, 86 then are closed and valve 88 opened to restore normal gas flow through the tubing 70 while trapping sample gas in the trap 82 for off-stream laboratory analysis.

EXAMPLES

The following examples are provided to illustrate the present invention and are not intended for the purposes of limitation. The processes reflected in the examples were conducted in a laboratory apparatus such as that illustrated in FIGS. 1 and 2.

EXAMPLE 1

Eight parts natural gas (approximately 90% methane + 10% impurities, flow rate = 4 sccm), 1 part elemental fluorine (flow rate = 0.5 sccm), and 200 parts helium (flow rate = 100 sccm) by volume were passed through a heated Monel tube reactor and over a copper foil substrate at a system pressure of about 760 Torr. The copper foil was given a gentle < 1 μm diamond grit polishing followed by removal of all excess grit prior to placement in the reactor. The high temperature zone of the reactor was held at about 865° C., and the gas mixture was allowed to flow for 65 hours. A diamond film was produced on the substrate over a 2 inch region away from the hottest portion of the reactor in a temperature zone that varied from about 750° C. to about 650° C. The film grew at an average rate of about 2 μm per hour. The film in the diamond growth area gave a Raman spectrum of a single sharp peak centered at 1332 cm$^{-1}$ indicating pure diamond in this area. Other areas on the substrate were found to have graphitic deposits on them. Using standard X-ray diffraction techniques, the measured interplanar spacings in Angstrom units for the diamond film are compared with the theoretical values in Table 1.

TABLE 1

| Interplanar Spacings (A) | |
| --- | --- |
| Observed | Theoretical |
| 2.048 | 2.06 |
| 1.255 | 1.261 |
| 1.066 | 1.0754 |

The close comparison between the theoretical and observed values is clear evidence that the compound being deposited is diamond rather than another form of carbon.

EXAMPLE 2

Eight parts methane (flow rate = 4 sccm), 1 part fluorine (flow rate = 0.5 sccm), and 200 parts helium (flow rate = 100 sccm) by volume were passed through a heated Monel tube reactor over a diamond polished Monel foil substrate at ambient pressure. The reactor high temperature zone was held at about 890° C. and the gas mixture was passed over the substrate for 24 hours. Diamond was deposited on the substrate in a region of the chamber running approximately 150° C. to 250° C. cooler than the hottest, central, region. The presence of diamond was verified by Raman spectroscopy (FIG. 3). The diamond growth rate was approximately 1 μm per hour.

EXAMPLE 3

Eight parts methane (flow rate = 4 sccm), 1 part fluorine (flow rate = 0.5 sccm), and 200 parts helium (flow rate = 100 sccm) were passed at ambient pressure through a heated Monel tube reactor (hottest zone about 880° C.) over a supported 12 inch length of 0.5 inch outside diameter diamond polished copper tubing for a period of 72 hours. Diamond was deposited in an area 0.75" long around the outside of the tube in the reactor region having a temperature of approximately 750° C. to 600° C. The diamond presence was verified by Raman spectroscopy, and the diamond growth rate was approximately 4 μm per hour.

EXAMPLE 4

One part difluoromethane (flow rate=0.5 sccm), 300 parts hydrogen (flow rate=150 sccm), and 100 parts helium (flow rate=50 sccm) were passed at ambient pressure through a heated Monel tube reactor (hottest zone about 875° C.) over a diamond polished Monel foil substrate for a period of 20 hours. Diamond (as verified by its Raman spectrum) was deposited on the substrate from a region in the reactor that varied in temperature from about 750° C. to 600° C. The diamond growth rate was approximately 4 μm per hour.

EXAMPLE 5

One part dichlorodifluoromethane (commercially available as "Freon 12"; flow rate 0.5 sccm), 300 parts hydrogen (flow rate=150 sccm), and 100 parts helium (flow rate 50 sccm) were passed through a heated Monel tube reactor (hottest zone about 890° C.) over a diamond polished Monel foil substrate for a period of 18 hours. Diamond (as verified by its Raman spectrum) was deposited on the substrate from a region in the reactor that varied in temperature from about 750° C. to 500° C. The diamond growth rate was approximately 4.3 μm per hour.

EXAMPLE 6

One part carbon tetrachloride (flow rate=0.5 sccm; introduced into the system with part of the helium flow), 300 parts hydrogen (flow rate=150 sccm), and 100 parts helium (flow rate=50 sccm) were passed at ambient pressure through a heated Monel tube reactor (hottest zone about 880° C.) over a diamond polished Monel foil substrate for a period of 19 hours. Diamond (as verified by Raman spectroscopy) was deposited on the substrate in a temperature region varying from approximately 750° C. to 600° C. The diamond growth rate was approximately 1 μm per hour.

EXAMPLE 7

One part tribromomethane (flow rate=0.5 sccm; introduced into the system with part of the helium flow), 300 parts hydrogen (flow rate=150 sccm), and 100 parts helium (flow rate=50 sccm) were passed at ambient pressure through a heated Monel tube reactor (hottest zone about 890° C.) over a diamond polished Monel foil substrate for a period of 43 hours. Diamond (as verified by Raman spectroscopy) was deposited on the substrate in a temperature region varying from approximately 750° C. to 600° C. The diamond growth rate was approximately 1 μm per hour.

EXAMPLE 8

One part methyl iodide (flow rate=0.5 sccm; introduced into the system with part of the helium flow), 300 parts hydrogen (flow rate=150 sccm), and 100 parts helium (flow rate=50 sccm) were passed at ambient pressure through a heated Monel tube reactor (hottest zone about 890° C.) over a diamond polished Monel foil substrate for a period of 18 hours. Diamond (as verified by Raman spectroscopy) was deposited on the substrate in a temperature region varying from approximately 750° C. to 600° C. The diamond growth rate was approximately 2.6 μm per hour.

EXAMPLE 9

One part chlorotrifluoroethylene (flow rate=0.5 sccm), 300 parts hydrogen (flow rate 150 sccm), and 100 parts helium (flow rate=50 sccm) were passed at ambient pressure through a heated Monel tube reactor (hottest zone about 880° C.) over a diamond polished Monel foil substrate for a period of 23 hours. Diamond (as verified by Raman spectroscopy) was deposited on the substrate in a temperature region varying from approximately 750° C. to 600° C. The diamond growth rate was approximately 1 μm per hour.

EXAMPLE 10

One part fluoromethane (flow rate=1 sccm) and 150 parts hydrogen (flow rate=150 sccm) were passed at ambient pressure with no dilution through a heated Monel tube reactor (hottest zone about 540° C.) over a diamond polished Monel foil substrate for a period of 24 hours. Diamond (as verified by Raman spectroscopy) was deposited over the entire 5 inch substrate. The entire substrate was held in a temperature region varying from approximately 540° C. to 250° C. The diamond growth rate was approximately 1.5 μm per hour.

EXAMPLE 11

One part fluoromethane (flow rate=0.5 sccm), 300 parts hydrogen (flow rate=150 sccm), and 100 pans helium (flow rate=50 sccm) were passed at ambient pressure through a heated quartz tube reactor (hottest zone about 590° C.) over a diamond polished silicon substrate for a period of 22 hours. Diamond (as verified by Raman spectroscopy) was deposited over the entire 1 inch substrate which was held at approximately 590° C. The diamond growth rate was approximately 0.5 μm per hour.

EXAMPLE 12

Five parts tetrafluoromethane (flow rate=2.5 sccm), 1 part fluorine (flow rate=0.5 sccm), and 200 parts helium (flow rate=100 sccm) by volume were passed at ambient pressure through a heated Monel reactor (hottest zone about 900° C.) over a diamond polished Monel foil substrate in a temperature region varying from about 900° C. to about 100° C. for a period of 24 hours. No diamond growth was found on any part of the substrate. This illustrates the importance of having hydrogen present in the system.

EXAMPLE 13

One part methane (flow rate=0.5 sccm), 300 parts hydrogen (flow rate=150 sccm), and 100 parts helium (flow rate=50 sccm) were passed at ambient pressure through a heated Monel tube reactor (hottest zone about 890° C.) over a diamond polished Monel foil substrate in a temperature region varying from about 890° C. to about 100° C. for a period of 18 hours. No diamond growth was found on any part of the substrate. This illustrates the importance of having a halogen present in the system.

The foregoing disclosure and description of the invention is illustrative and explanatory only and various changes may be made in the details of the method and apparatus disclosed without departing from the scope of the invention, which is measured by the appended claims.

What is claimed is:

1. A method of depositing diamond on a substrate, said method comprising:
   providing a gas mixture comprising a halogen-containing species, a hydrogen-containing species and a carbon-containing species;
   heating said gas mixture to a first temperature of from about 400° C. to about 920° C.;
   reducing the temperature of said gas mixture to a second temperature of from about 250° C. to 750° C., said second temperature being at least approximately 100° C. cooler than said first temperature; and
   flowing said gas mixture over a substrate, at least a portion of said substrate being heated to approximately said second temperature so as to deposit a film comprising substantially pure diamond on at least part of said portion of said substrate.

2. The method according to claim 1 wherein said gas mixture is not pre-treated for activation of said gas mixture to a high energy level before flowing over said substrate.

3. The method according to claim 1 wherein said halogen in said halogen-containing species is selected from the group consisting of fluorine, chlorine, bromine and iodine.

4. The method according to claim 1 wherein said halogen-containing species is selected from the group consisting of fluorine gas, chlorine gas, bromine gas and iodine gas.

5. The method according to claim 1 wherein said gas mixture comprises a chlorofluorocarbon and a hydrogen-containing species.

6. The method according to claim 1 wherein said gas mixture comprises a halohydrocarbon and a hydrogen-containing species.

7. The method according to claim 1 wherein said hydrogen-containing species comprises hydrogen gas.

8. The method according to claim 1 wherein said gas mixture comprises less than approximately 10% by volume of said carbon-containing species.

9. The method according to claim 1 wherein said gas mixture contains more atoms of hydrogen than of carbon.

10. The method according to claim 9 wherein said gas mixture contains approximately at least four times as many atoms of hydrogen as of carbon.

11. The method according to claim 1 wherein said gas mixture comprises additionally an inert gas selected from the group consisting of helium, neon, argon, krypton, xenon, carbon monoxide and nitrogen.

12. The method according to claim 1 wherein said gas mixture flowing over said substrate is at from about one-half to about several atmospheres of pressure.

13. The method according to claim 1 wherein said substrate is suspended in said gas mixture flowing through said reactor, whereby all sides of said substrate are exposed to said gas mixture.

14. The method according to claim 1 wherein said substrate is selected from a group consisting of Monel, copper, nickel, silicon, carbon, silicon carbide, tungsten carbide, tantalum carbide, aluminum and ceramic materials.

15. The method according to claim 1 wherein said substrate comprises a regular shape selected from the group consisting of a foil, a disc, a cylinder, a wire, a sphere, and a right quadrilateral prism.

16. The method according to claim 1 wherein said substrate is irregular in shape.

17. The method according to claim 1 comprising additionally the step of rubbing at least a portion of the surface of said substrate with a fine polishing grit prior to flowing said gas mixture over said substrate.

18. The method according to claim 1 wherein said grit comprises a diamond grit.

19. A method of depositing diamond on a substrate, said method comprising:
    providing a gas mixture comprising a fluorine-containing species, a hydrogen-containing species and a carbon-containing species; and
    flowing said gas mixture without pre-treatment for activation of said gas mixture to a high energy level, over a heated substrate, so as to deposit a film comprising substantially pure diamond on at least a portion of said substrate.

20. The method according to claim 19 wherein said substrate is heated to a temperature range of from about 250° C. to about 750° C.

21. The method according to claim 19 wherein said gas mixture flowing over said substrate is heated to a temperature range of from about 250° C. to about 750° C.

22. The method according to claim 19 wherein said gas mixture is at a pressure of approximately one atmosphere.

23. The method according to claim 19 wherein said fluorine-containing species is fluorine gas.

24. The method according to claim 19 wherein said gas mixture comprises a chlorofluorocarbon and a hydrogen-containing species.

25. The method according to claim 19 wherein said gas mixture comprises a halohydrocarbon and a hydrogen-containing species.

26. The method according to claim 19 wherein said hydrogen-containing species comprises hydrogen gas.

27. The method according to claim 19 wherein said gas mixture comprises less than approximately 10% by volume of said carbon-containing species.

28. The method according to claim 19 wherein said gas mixture contains more atoms of hydrogen than of carbon.

29. The method according to claim 28 wherein said gas mixture contains approximately at least four times as many atoms of hydrogen as of carbon.

30. The method according to claim 19 wherein said gas mixture comprises additionally an inert gas selected from the group consisting of helium, neon, argon, krypton, xenon, carbon monoxide and nitrogen.

31. The method according to claim 19 wherein said gas mixture flowing over said substrate is at from about one-half to about several atmospheres of pressure.

32. The method according to claim 19 wherein said substrate is suspended in said gas mixture flowing through said reactor, whereby all sides of said substrate are exposed to said gas mixture.

33. The method according to claim 19 wherein said substrate is selected from a group consisting of Monel, copper, nickel, silicon, carbon, silicon carbide, tungsten carbide, tantalum carbide, aluminum and ceramic materials.

34. The method according to claim 19 wherein said substrate comprises a regular shape selected from the group consisting of a foil, a disc, a cylinder, a wire, a sphere, and a right quadrilateral prism.

35. The method according to claim 19 wherein said substrate is irregular in shape.

36. The method according to claim 19 comprising additionally the step of rubbing at least a portion of the surface of said substrate with a fine polishing grit prior to flowing said gas mixture over said substrate.

37. The method according to claim 19 wherein said grit comprises a diamond grit.

38. A method of depositing diamond on a substrate, said method comprising:
  providing a gas mixture comprising a halogen-containing species, a hydrogen-containing species and a carbon-containing species;
  flowing said gas mixture through a reactor at approximately one atmosphere of pressure;
  heating said gas mixture to a first temperature of from about 400° C. to about 920° C.;
  reducing the temperature of said gas mixture to a second temperature at least approximately 100° C. cooler than said first temperature and in the range of from about 250° C. to about 750° C.;
  flowing said gas mixture at said second temperature over a substrate positioned in said reactor, so as to deposit substantially pure diamond on at least a portion of said substrate.

39. The method according to claim 38 wherein said gas mixture is not pre-treated for activation of said gas mixture to a high energy level before flowing said gas mixture over said substrate.

40. The method according to claim 38 wherein said first temperature range is from about 800° C. to about 920° C.

41. A method of depositing diamond on a substrate, said method comprising:
  providing a gas mixture comprising a halogen-containing species, a hydrogen-containing species and a carbon-containing species;
  heating said gas mixture to a first temperature of from about 400° C. to about 920° C.;
  reducing the temperature of said gas mixture to a second temperature of from about 250° C. to 750° C.; and
  flowing said gas mixture over a substrate, at least a portion of said substrate being heated to approximately said second temperature, so as to deposit diamond on at least part of said portion of said substrate.

42. The method according to claim 41 wherein said gas mixture is not pretreated for activation of said gas mixture to a high energy level before flowing over said substrate.

43. The method according to claim 41 wherein said halogen in said halogen-containing species is selected from the group consisting of fluorine, chlorine, bromine and iodine.

44. The method according to claim 41 wherein said gas mixture comprises a chlorofluorocarbon and a hydrogen-containing species.

45. The method according to claim 41 wherein said gas mixture comprises a halohydrocarbon and hydrogen-containing species.

46. The method according to claim 41 wherein said gas mixture comprises less than approximately 10% by volume of said carbon-containing species.

47. The method according to claim 41 wherein said gas mixture flowing over said substrate is at from about one-half to about several atmospheres of pressure.

48. The method according to claim 41 wherein said halogen-containing species comprises a single molecule having a plurality of different halogens therein.

49. The method according to claim 41 wherein said diamond comprises a thin polycrystalline diamond film.

50. The method according to claim 41 wherein said diamond comprises diamond particles.

51. A method of depositing diamond on a substrate, said method comprising:
  providing a gas mixture comprising a halogen-containing species, a hydrogen-containing species and a carbon-containing species;
  heating said gas mixture to a first temperature of from about 800° C. to about 920° C.;
  reducing the temperature of said gas mixture to a second temperature of from about 250° C. to 750° C.; and
  flowing said gas mixture over a substrate, at least a portion of said substrate being heated to approximately said second temperature, so as to deposit diamond on at least part of said portion of said substrate.

52. The method according to claim 51 wherein said gas mixture is not pretreated for activation of said gas mixture to a high energy level before flowing over said substrate.

53. The method according to claim 51 wherein said halogen in said halogen-containing species is selected from the group consisting of fluorine, chlorine, bromine and iodine.

54. The method according to claim 51 wherein said gas mixture comprises a chlorofluorocarbon and a hydrogen-containing species.

55. The method according to claim 51 wherein said gas mixture comprises a halohydrocarbon and hydrogen-containing species.

56. The method according to claim 51 wherein said gas mixture comprises less than approximately 10% by volume of said carbon-containing species.

57. The method according to claim 51 wherein said gas mixture flowing over said substrate is at from about one-half to about several atmospheres of pressure.

58. The method according to claim 51 wherein said halogen-containing species comprises a single molecule having a plurality of different halogens therein.

59. The method according to claim 51 wherein said diamond comprises a thin polycrystalline film of substantially pure diamond.

60. The method according to claim 51 wherein said diamond comprises substantially pure diamond particles.

61. A method of depositing diamond on a substrate, said method comprising:
  providing a gas mixture comprising a halogen-containing species, a hydrogen-containing species and a carbon-containing species; and
  flowing said gas mixture, without pre-treatment for activation of said gas mixture to a high energy level, over a heated substrate so as to deposit diamond on at least a portion of said substrate,
  said gas mixture not including elemental chlorine and not including carbon tetrachloride.

62. The method according to claim 61 wherein said substrate is heated to a temperature of from about 250° C. to about 750° C.

63. The method according to claim 61 wherein said gas mixture flowing over said substrate is heated to a temperature of from about 250° C. to about 750° C.

64. The method according to claim 61 wherein said halogen in said halogen-containing species is selected from a group consisting of fluorine, bromine and iodine.

65. The method according to claim 61 wherein said gas mixture comprises a chlorofluorocarbon and a hydrogen-containing species.

66. The method according to claim 61 wherein said gas mixture is heated to a first temperature of from about 400° C. to about 920° C., is reduced to a second temperature of from about 250° C. to about 750° C. and said substrate is heated to approximately said second temperature.

67. The method according to claim 61 wherein said gas mixture comprises less than approximately 10% by volume of said carbon containing species.

68. The method according to claim 61 wherein said gas mixture contains more atoms of hydrogen than of carbon.

69. The method according to claim 61 wherein said gas mixture contains approximately at least four times as many atoms of hydrogen as of carbon.

70. The method according to claim 61 wherein said halogen containing species comprises a single molecule having a plurality of different halogens therein.

71. The method according to claim 61 wherein said diamond comprises a thin polycrystalline diamond film.

72. The method according to claim 61 wherein said diamond comprises diamond particles.

73. A method of depositing diamond on a substrate, said method comprising:
providing a gas mixture comprising a halogen-containing species, a hydrogen-containing species and a carbon-containing species;
flowing said gas mixture, without pre-treatment for activation of said gas mixture to a high energy level, through a reactor;
heating said gas mixture to a first temperature of from about 400° C. to about 920° C.;
reducing the temperature of said gas mixture to a second temperature of from about 250° C. to about 750° C.; and
flowing said gas mixture at said second temperature over a substrate, so as to deposit diamond on at least a portion of said substrate.

74. A method of depositing diamond on a substrate, said method comprising:
providing a gas mixture comprising a halogen-containing species, a hydrogen-containing species and a carbon-containing species;
flowing said gas mixture, without pre-treatment for activation of said gas mixture to a high energy level, through a reactor;
heating said gas mixture to a first temperature of from about 800° C. to about 920° C.;
reducing the temperature of said gas mixture to a second temperature of from about 250° C. to about 750° C.; and
flowing said gas mixture at said second temperature over a substrate, so as to deposit diamond on at least a portion of said substrate.

75. A method of depositing diamond on a substrate, said method comprising:
providing a gas mixture comprising a single molecule having a plurality of different halogens therein, a hydrogen containing species and a carbon containing species; and
flowing said gas mixture, without pre-treatment for activation of said gas mixture to a high energy level, over a heated substrate, so as to deposit diamond on at least a portion of said substrate.

* * * * *